United States Patent [19]

Baker

[11] 4,148,934
[45] Apr. 10, 1979

[54] SECONDARY PHOTOCURING OF PHOTOCURED PRINTING PLATE, APPARATUS AND METHOD

[75] Inventor: Noel J. Baker, Herts, England

[73] Assignee: W. R. Grace Ltd., London, England

[21] Appl. No.: 856,944

[22] Filed: Dec. 2, 1977

[51] Int. Cl.² ............................................. B25D 3/06
[52] U.S. Cl. ...................................... 427/54; 96/35.1; 118/641; 250/504
[58] Field of Search ...................... 96/27 R, 35.1, 36.3; 427/44, 54; 250/492 R, 503, 504; 118/620, 641

[56] References Cited
U.S. PATENT DOCUMENTS

| | | | |
|---|---|---|---|
| 2,791,504 | 5/1957 | Plambeck | 96/35.1 |
| 3,328,194 | 6/1967 | Kasper | 427/54 |
| 3,573,975 | 4/1971 | Dhaka et al. | 427/54 |
| 3,723,120 | 3/1973 | Hummel | 96/35.1 |
| 3,846,149 | 11/1974 | Meunier | 427/44 |
| 4,011,084 | 3/1977 | Hartmann et al. | 96/35.1 |
| 4,016,306 | 4/1977 | Miyagawa et al. | 427/54 |
| 4,038,078 | 7/1977 | Sakurai et al. | 96/35.1 |

Primary Examiner—John H. Newsome
Attorney, Agent, or Firm—Edward J. Hanson, Jr.; C. Edward Parker

[57] ABSTRACT

This invention is directed to an apparatus and method for secondary curing of a selectively photocured liquid polymer polymeric printing plate by mechanically stripping the selectively photocured printing plate to remove at least substantially all of the uncured liquid composition and placing the stripped printing plate under an inert liquid, in particular water, and exposing it to actinic light.

4 Claims, 3 Drawing Figures

SECONDARY PHOTOCURING OF PHOTOCURED PRINTING PLATE, APPARATUS AND METHOD

BACKGROUND OF THE INVENTION

This invention relates to secondary curing of printing plates fabricated from liquid polymer with the liquid polymer having been first selectively photocured to provide the printing pattern.

It is known by those skilled in the art that certain photopolymeric curing compositions when cured with actinic light under atmospheric conditions, e.g. with air in contact with the surface of the composition, results in a partially cured material having a tacky surface. Several methods have been proposed to overcome this drawback. For example, acrylic and methacrylic compositions can be irradiated in a nitrogen atmosphere which results in a tack-free cured solid product. See U.S. Pat. No. 3,924,023. However, the use of nitrogen per se has the drawback in that, although it excludes oxygen from the surface of the material to be cured, it is necessary to use large amounts of nitrogen. Another method used to overcome the air inhibition during a polymerization of acrylate and methacrylate polymers is the employment of polythiols along with the acrylates and methacrylates in the system to be irradiated. See U.S. Pat. No. 4,008,341. Yet another method of excluding oxygen from the curing is the use of an antiwrinkle plastic sheet directly in contact with the composition to be cured. See U.S. Pat. No. 3,687,785. This sheet can be removed subsequent to the radiation step.

It is therefore a primary object of the instant invention to provide an apparatus and method to form a printing plate desirably having a tack-free surface. The basic underwater post exposure invention is described and claimed in copending U.S. Pat. application Ser. No. 843,391 entitled Photocuring Process for Eliminating Air Inhibition, filed Oct. 19, 1977, now abandoned and assigned to the same assignee as the present invention. Other advantages of secondary curing by the use of this invention also exists in providing a thoroughly cleaned and hardened printing plate face even when the surface might be substantially tack-free without the post exposure.

SUMMARY OF THE INVENTION

By an aspect of the invention a method is provided for expeditiously carrying out the secondary curing of a printing plate having a printing face that has been selectively photocured producing areas of cured solidified polymer and areas of uncured liquid composition. The printing face is mechanically stripped removing at least substantially all of the areas of uncured liquid composition leaving an exposed stripped surface. The mechanical stripping is preferably primarily carried out by the operation of a stationary air knife with the printing plate being conveyed past the air knife during at least a portion of said mechanical stripping. The stripped surface is then covered with an inert liquid and the oxygen in the air is substantially sealed out. Preferably the printing plate is conveyed from the location of the mechanical stripping to another location where the stripped surface is covered with the inert liquid. The stripped surface is exposed to actinic light through the inert liquid.

The removal of the liquid, which is preferably water, is facilitated in a most desirable way by inclining the printing plate in a sloping position on the conveying means. By providing a gradual angle to the slope the liquid can be cascaded over the stripped surface to provide the covering that seals out the oxygen in the air thus not requiring a separate drying position. The actinic light is also very preferably used to facilitate drying.

By another aspect of the invention an apparatus is provided for expeditiously carrying out the secondary curing. Mechanical stripping means are provided to strip at least substantially all of the areas of uncured liquid composition from the printing face thereby leaving an exposed stripped surface. The mechanical stripping means preferably include an air knife capable of stripping the bulk of the uncured liquid composition from the selectively photocured printing plate. Covering means are provided for covering the stripped surface with an inert liquid and thereby substantially sealing out the oxygen in the air. Preferably the mechanical stripping means is spaced from the means for covering the stripped surface and the apparatus includes a conveyor for transferring the printing plate from the stripping means to the covering means. An actinic light source is positioned to impinge actinic light on the stripped suface while it is covered with the inert liquid.

Best Mode

Figure 1:
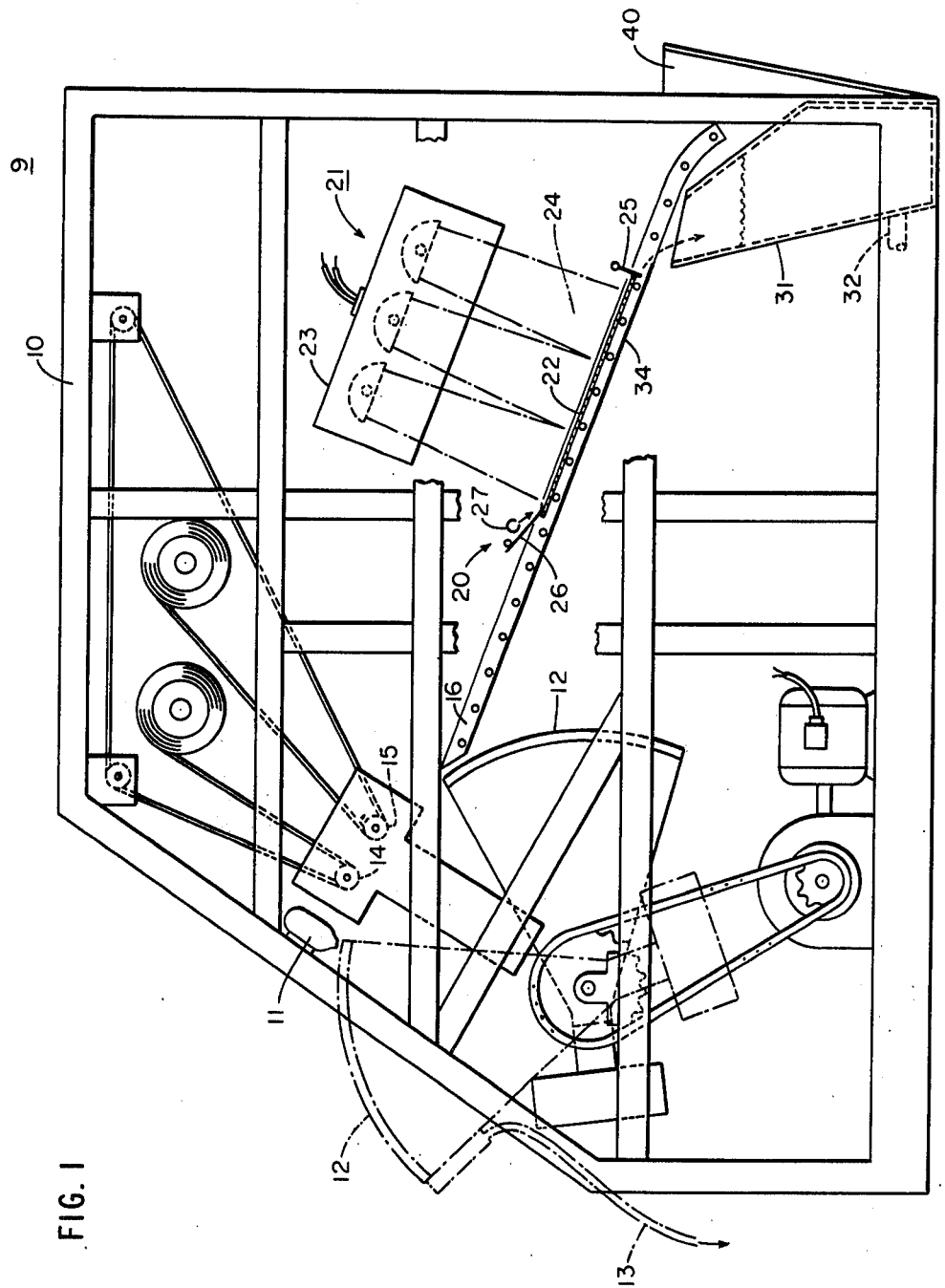
FIG. 1 is a partial cut-away elevation view and schematic representation of the major elements of the apparatus of the present invention.
Figure 2:
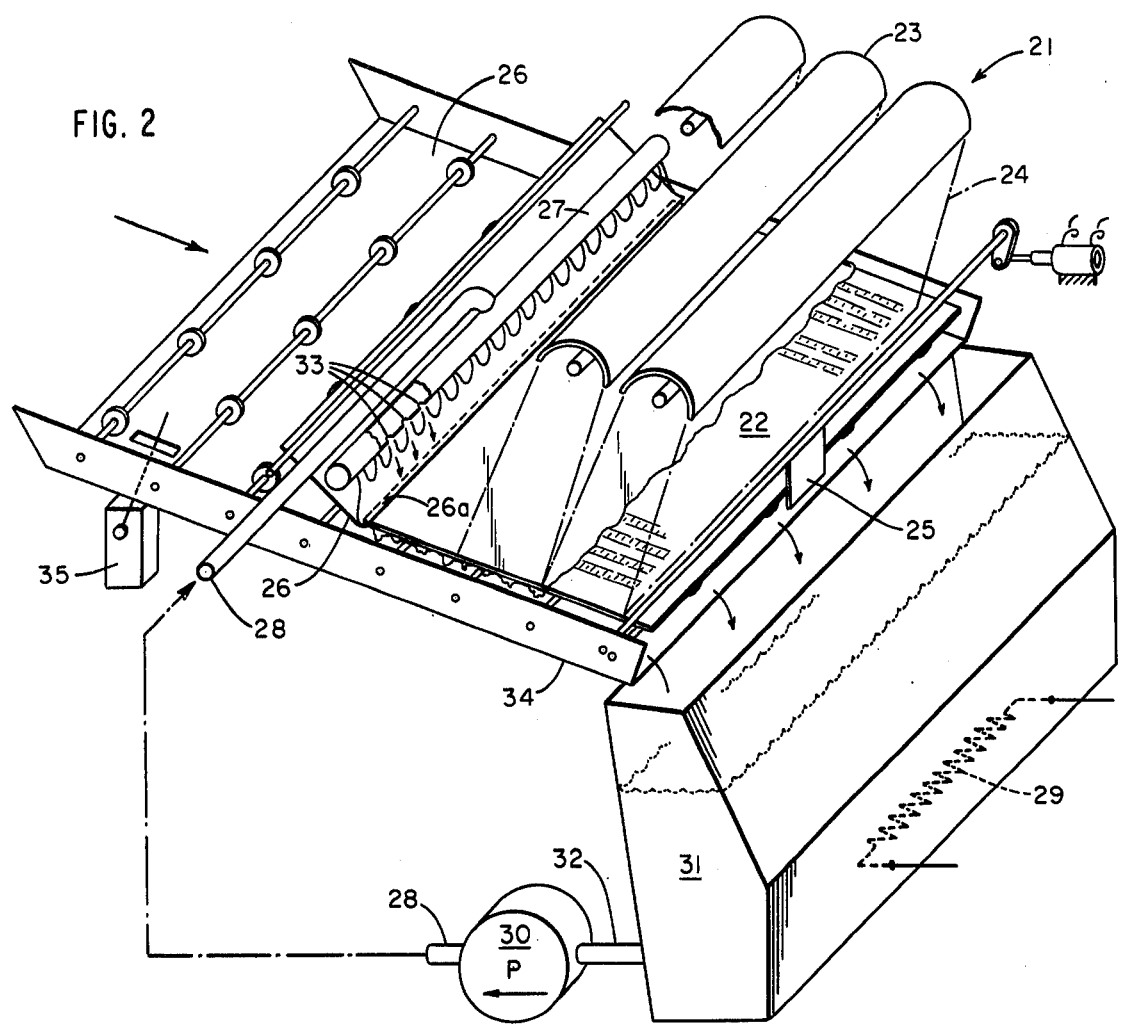
FIG. 2 is a partial cut-away isometric view of the mechanism 21 of FIG. 1.

FIGS. 1 and 2 illustrate an apparatus for secondary curing of liquid polymer printing plates that have previously been selectively photocured producing areas of cured solidified polymer and areas of uncured liquid composition. The secondary curing converts the selectively photocured printing plates into printing plates that are ready for use. While the machine as illustrated may be directly assembled with other components such as the equipment for initially selectively pattern photocuring the liquid polymer, such other components are not integral to the cooperation and synergistic interaction and effect of the components of the present invention, which components are here shown and described.

The machine is preferably assembled as a unitary apparatus on a frame 10 comprised of cross bars and vertical and horizontal girders. These frame members support the components in predetermined relation to form the most preferred form of the apparatus of the present invention. An air knife 11 is provided for stripping the uncured polymer from the selectively photocured printing plate that includes areas of uncured liquid composition. The air knife is capable of stripping at least the bulk of the uncured liquid composition from the selectively photocured printing plate producing a bulk stripped surface on the printing plate. A platen 12 mounts the printing plate and moves with an arcuate motion past the air knife 11 to provide for the stripping of the uncured composition from the printing plate. The printing plate is held in position on the platen 12 by a vacuum pulled through vacuum line 13. The thus bulk stripped printing plate then passes under blotting means 14 and 15 which contain paper passing over rollers which engage with the bulk stripped face of the printing plate to blot up any excess uncured liquid remaining on the plate. This blotting paper means also should be considered as constituting part of the mechanical stripping means. The mechanical stripping components are further detailed in U.S. Pat. No. 3,922,751, owned by the same assignee as the present application, the specification of which is incorporated herein by reference.

An inclined conveyor means 16 receives the thus stripped plate from the platen 12. The conveyor 16 may either have a positive drive or operate as shown by gravity by being provided with a plurality of rollers over which the printing plate passes. Appropriate rollers could be made of nylon held in position with rubber O-rings on stainless steel rods.

Disposed intermediate the ends of conveying means 16 is a bathing or covering means 20 which is part of a liquid post exposing mechanism 21. Covering means 20 covers the stripped surface of the plate 22 with an inert liquid, preferably water.

The liquid post curing mechanism 21 contains an actinic light source 23 which casts a light beam 24 over the printing face of the plate 22. The printing plate 22 rests against plate stop or gate 25. Plate stop 25 holds the plate 22 trapped in position under a water weir plate 26 which has an upcurved lip 26a to provide both a curved surface for facilitating the slipping of the printing plate thereunder without damage and the even spreading and sheeting of the water for flow out across the plate with an even distribution as is shown in prospective view of FIG. 2. It may be seen that the gate 25 is associated with a sloping portion of the conveyor 16 for retaining the printing plate stationery during the covering of the printing plate 22 with the inert liquid.

The liquid is supplied to the weir 26 by a liquid dispensing flow tube 27 which is fed through feed pipe 28 diagrammatically connected to a pump 30 which is connected to a liquid reservoir 31 via connecting means 32. The liquid flow tube or pipe 27 is drilled with dispensing openings 33 which are spaced evenly linearly along the tube which extends linearly across the weir 26 to provide a substantially even flow of liquid in small streams onto the plate. A good liquid spread and distribution of the liquid into a substantially uninterrupted sheet is provided.

A catch pan 34 is provided under the conveying means 16 to pass the liquid as it flows from the printing plate 22 into a reservoir 31 adjacent gate 25. The reservoir 31 is preferbly heated by a heater 29 to facilitate rapid evaporation of the liquid from the printing plate after post exposure. After the secondary curing has been completed the printing plate is released by gate 25 and passes on down the conveyor and into bin 40.

Figure 3:
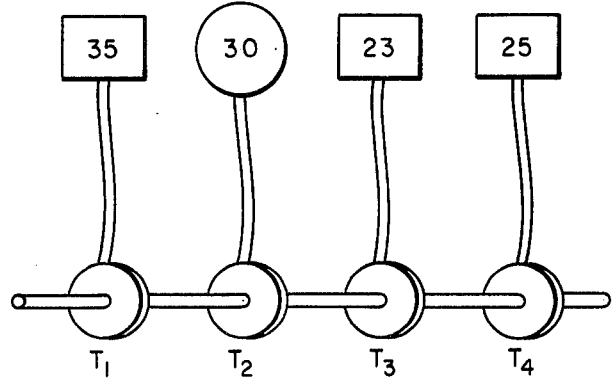
FIG. 3 is a schematic illustration of the sequencing arrangement for the mechanism of FIG. 2.

Looking next at FIG. 3 the timing sequence arrangement of the mechanism 21 of my invention is illustrated schematically. The mechanism 21 is sequenced independently of the stripping means and is initiated by the start signal means 35 sensing the passing of the leading edge of the plate. This activates a timing control having a plurality of timing sequencing means such as a series of cams arranged on a single timing shaft which for example rotates through one revolution per cycle. Timer T1 is connected to the starting means 35 and cycles the timer control itself. Timer T2 controls the water flow and provides sufficient delay before water flow to allow the printing plate 22 to position itself properly against gate 25. Timer T2 starts the flow of water by activating pump 30. Timer T3 delays the switching on of the actinic light source 23 until after the plate 22 is covered with water as determined by a set time delay from the switching on of pump 30. Timer T2 then shuts off the pump and water after a preset delay while the actinic lights remain on for an additional preset period of time to help dry the printing plate 22. After this delay the actinic light is switched off by Timer T2 and thereafter timer T4 opens the gate 25 to allow the printing plate 22 to exit the mechanism 21 and then returns the gate to the closed portion. Lastly Timer T1 cuts off the timed cycle having allowed the timers to reposition themselves in their starting positions.

OPERATION

In operation this invention is particularly directed to a secondary curing of a printing plate having a printing face that has been selectively photocured producing areas of cured solidified polymer and areas of uncured liquid composition. By uncured liquid composition it is meant that the composition is relatively fluid as contrasted to the cured solidified polymer which is relatively solid. It is not necessary that the cured material be absolutely totally cured or that the uncured material have undergone no curing at all for the operation of the present invention. The selectively photocured printing plate 22 is placed by hand on the platen 12 of the apparatus shown in FIG. 1 when the platen is in the position shown in phantom line. The platen 12 then rotates as is illustrated to its solid line position passing under air knife 11 which strips the bulk of the uncured liquid composition from the printing face. As the platen 12 continue to rotate it passes under the blotters 14 and 15 which provide a subsequent blotting action.

The now mechanically stripped printing plate is then deposited onto the conveyor 16. It slides down the conveyor 16 by gravity passing the sequence starting means 35 of the post curing mechanism 21. The plate continues to pass over the rollers of conveyor 16 passing under the lower edge of the weir 26 and sliding under the weir until it comes to rest against the gate 25 which is closed. The starting signal means 35 immediately signals the timing device to begin its sequencing. Accordingly immediately after the plate come to rest against the gate 25 the pump 30 is activated supplying inert liquid, preferably water, to feed pipe 28 where it exits through the drills 33 onto the weir 26 which causes the streams to flow together and form a sheet flowing out across the plate 22 cascading over the plate, covering the plate and substantially sealing out the oxygen in the air. The printing plate is inclined by the conveyor in a sloping position at a gradual angle. By a gradual angle it is meant a sufficient angle to provide a steady flow of the liquid and yet not so steep that the liquid will rush over the plate causing gaps or a rolling irregular effect.

Shortly after the plate is completely covered with the liquid, Timer T3 activates the actinic light source 23. After sufficient time to post cure the plate to the desired extent, in its preferred usage to the extent of reducing or eliminating all tackiness on the surface of the plate, the pump 38 is shut off stopping the liquids cascading over the plate and allowing the liquid to drain from the plate 22. Of course there can be a very slight delay from the time the pump is switched on until the time the liquid is actually flowing from the feed pipe 28 and this would be takem care of in the usual manner by properly setting the timing sequence. The actinic light would remain on for additional time sufficient to assist in the complete drying of the plate 22 after which the timer T3 would shut off the actinic light and the gate 25 would be opened by Timer T4. The plate 22 would then progress into bin 40 by gravity passing above the reservoir 31.

The water flowing across the plate during the post exposure and also the water draining from the plate at the end of the post exposure, flows from the plate into the reservoir 31. It is heated in the reservoir for recycle via the pump 30 through connecting means 32 and 28 for secondary curing of subseqent printing plates.

The time periods for operation of the printing plate equipment are set by empirical testing to fit the particular printing plate that the operation is to be carried out with. Each polymer variation and each variation in the initial selective photocuring of the printing plate can effect the optimum timed sequencing somewhat. A typical underwater post exposure period might be from about 45 seconds to 1 minute and the drying period might typically take about 1 minute if the water exits the feed pipe 27 at approximately 70° C.

One of the most likely modifications of my most preferred embodiment would be positioning the printing plate horizontally underwater during the underwater post exposure and then lifting the plate and positioning it for drying as described in my most preferred embodiment under the actinic light. My invention might also be extended to other liquid polymer photocured relief objects that have been selectively photocured producing areas of cured solidified polymer and areas of uncured liquid composition. Broadly the radiation could be other than by actinic light if the radiation has an energy greater than 3 electron volts for a time sufficient to provide the desired underwater post exposure.

While in accordance with the patent statutes, I have described what presently is considered the preferred embodiment of my invention, it will be obvious to those skilled in the art that numerous changes and modifications may be made therein without departing from the invention and it is therefore aimed in the appended claims to cover all such equipment variations as fall in the true spirit and scope of the invention.

I claim:

1. A method for secondary curing of a printing plate having a printing face that has been selectively photocured producing areas of cured solidified polymer and areas of uncured liquid composition said method comprising
    (a) mechanically stripping said printing face removing at least substantially all of the areas of uncured liquid composition thereby leaving an exposed stripped surface, said mechanical stripping including the operation of a stationery air knife and conveying said printing plate past said air knife during at least a portion of said mechanical stripping;
    (b) conveying said printing plate from the location of said mechanical stripping to another location, inclining said printing plate in a sloping position at a gradual angle and stopping said printing plate in said sloped position by a gate means and holding it so disposed;
    (c) covering said stripped surface with water that is heated to above ambient temperature by depositing said water in closely spaced streams linearly across a weir plate and merging the streams on the weir plate to form a thin sheet of water and cascading said water over said stripped surface while said printing plate is in said sloping position and substantially sealing out the oxygen in the air;
    (d) exposing said stripped surface to actinic light through said water;
    (e) removing said water from said stripped surface by stopping said cascading;
    (f) continuing to hold said printing plate in said sloped position by said gate;
    (g) continuing to expose said stripped surface to actinic light;
    (h) opening said gate and releasing said printing plate from said sloped position; and
    (i) recirculating said water for secondary curing of subsequent printing plates.

2. Apparatus for secondary curing of a printing plate having a printing face that has been selectively photocured producing areas of cured solidified polymer and areas of uncured liquid composition, said apparatus comprising
    (a) stripping means for mechanically stripping said printing face removing at least substantially all of the areas of uncured liquid composition thereby leaving an exposed stripped surface, said stripping means including an air knife capable of stripping the bulk of said uncured liquid composition from said selectively photocured printing plate;
    (b) a covering means having a weir plate and a drilled pipe extending linearly acros said weir plate for depositing streams of inert liquid on the weir plate to form a thin sheet of said inert liquid and supplying it to cover said stripped surface thereby substantially seal out the oxygen in the air, said covering means spaced from said stripping means and connected thereto by a conveyor having a sloped portion at said covering means;
    (c) a gate associated with said sloped portion of said conveyor for retaining said printing plate stationary on said sloped portion of said conveyor during said covering;
    (d) a reservoir adjacent said gate for receiving said inert liquid;
    (e) a pump connected to said reservoir and said drilled pipe for delivering said inert liquid from said reservoir to said drilled pipe; and
    (f) an actinic liquid source positioned to impinge actinic light on said stripped surface while it is covered with said inert liquid.

3. The apparatus of claim 2 wherein said mechanical stripping means includes a blotting paper means for engaging blotting paper with the bulk stripped surface of said printing plate, said apparatus further comprising a heater in said reservoir.

4. A method for secondary curing of a printing plate having a printing face that has been selectively photocured producing areas of cured solidified polymer and areas of uncured liquid composition said method comprising
    (a) mechanically stripping said printing face removing at least substantially all of the areas of uncured liquid composition thereby leaving an exposed stripped surface;
    (b) positioning said stripped surface in a sloping position;
    (c) covering said stripped surface in said sloping position with a flowing inert liquid and substantially sealing out the oxygen in the air; and
    (d) exposing said stripped surface in said sloping position to actinic light through said flowing inert liquid.

* * * * *